United States Patent
Shigenaka et al.

(12)

(10) Patent No.: US 6,504,153 B1
(45) Date of Patent: Jan. 7, 2003

(54) SEMICONDUCTOR INFRARED DETECTING DEVICE

(75) Inventors: Keitaro Shigenaka, Hachioji (JP); Yoshinori Iida, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 15 days.

(21) Appl. No.: 09/624,996

(22) Filed: Jul. 25, 2000

(30) Foreign Application Priority Data

Jul. 26, 1999 (JP) .......................................... 11-211286
Sep. 24, 1999 (JP) .......................................... 11-271117

(51) Int. Cl.[7] .............................................. H01L 27/14
(52) U.S. Cl. ..................................... 250/338.4; 257/428
(58) Field of Search ....................... 250/338.4; 257/428, 257/431, 436, 461, 466; 438/73, 57, 63

(56) References Cited

U.S. PATENT DOCUMENTS

| | | | | |
|---|---|---|---|---|
| 3,969,746 A | * | 7/1976 | Kendall et al. ............... | 257/20 |
| 4,948,963 A | | 8/1990 | Ballingall | |
| 5,311,006 A | * | 5/1994 | Awamoto ................. | 250/208.1 |
| 5,549,763 A | * | 8/1996 | Sano et al. ................. | 136/255 |
| 6,163,061 A | | 12/2000 | Iida | |

OTHER PUBLICATIONS

T. Ishikawa, et al. "Low–cost 320 X 240 Uncooled IRFPA Using Conventional Silicon IC Process", Part of the SPIE Conference of Infrared Technology and Applications XXV, SPIE vol. 3698, Apr. 1999, pp. 556–564.

* cited by examiner

Primary Examiner—Georgia Epps
Assistant Examiner—Richard Hanig
(74) Attorney, Agent, or Firm—Oblon, Spivak, McClelland, Maier & Neustadt, P.C.

(57) ABSTRACT

In a semiconductor infrared image pick-up system, thermo-sensing sections arrayed in a matrix format are supported by a supporting section above a base substrate in a floating state such that they are thermally independent of the base substrate and of each other. Each thermo-sensing section includes first and second semiconductor layers stacked on an insulating layer to form a pn junction. The second layer is in contact with the first layer via an irregular interface to enlarge the surface area of the pn junction. An infrared image is picked up with reference to a change in electric current flowing through the pn junctions, which is caused when the thermo-sensing sections are irradiated with infrared rays in a state where forward bias voltage is applied to the pn junctions.

25 Claims, 7 Drawing Sheets

SEMICONDUCTOR INFRARED DETECTING DEVICE

CROSS-REFERENCE TO RELATED APPLICATIONS

This application is based upon and claims the benefit of priority from the prior Japanese Patent Applications No. 11-211286, filed Jul. 26, 1999; and No. 11-271117, filed Sep. 24, 1999, the entire contents of which are incorporated herein by reference.

BACKGROUND OF THE INVENTION

The present invention relates to a semiconductor infrared detecting device for detecting infrared rays by using the forward characteristic of a pn junction of semiconductor layers. The present invention also relates to an infrared detecting system and an infrared image pick-up system, which employ the device.

A method of measuring temperature by using a pn junction has been realized as a temperature sensor for measuring a low temperature, e.g., within the liquid nitrogen temperature range, but is limited to a point sensor with a relatively large size of several-millimeter-square. In recent years, however, it has become possible to apply the principle of this method to semiconductor infrared image pick-up systems, because micro-machining techniques have been developed and SOI (Silicon On Insulator) substrates with a high quality and a large size have become available.

Semiconductor infrared image pick-up systems utilize a detecting principle in which a thermo-sensing section receives a temperature difference on a target object, and a temperature change in the thermo-sensing section due to this is converted into an electrical signal. Accordingly, the larger the thermo-sensing section is, the higher the sensitivity grows. However, where, for example, thermo-sensing sections each having a size of 50 μm-square and a standard optical system are used while a target object has a temperature difference of 0.1° C., only a several-mK change can be caused in each thermo-sensing section. In this case, a signal to be obtained is less than one-hundredth that of conventional point sensors.

In semiconductor infrared image pick-up systems, as the number of arrayed sensors or detecting devices is increased, the diameter of the optical system to be used becomes larger. For example, even if each sensor has a size as small as 50 μm-square, where the sensors are arrayed in the format of 320×240, the pixel region becomes as large as 16 mm×12 mm. Due to a trade-off relationship between sensitivity and pixel region size, each pixel size is thought to be 50 μm-square at most. In addition, it is currently demanded to increase the number of pixels, and decrease the size of optical systems, and thus it is thought that each pixel size will be further reduced.

Proc. of SPIE 3698 (1999), pp. 556 to 564, discloses, as a semiconductor infrared detecting device using a pn junction, a structure in which a plurality of pn junctions are formed in one thermo-sensing section and connected to each other in series by using micro-lithography. This structure is conceived to increase a signal voltage to be sufficiently larger than that of noise generated in the thermo-sensing section.

Figure 15A:
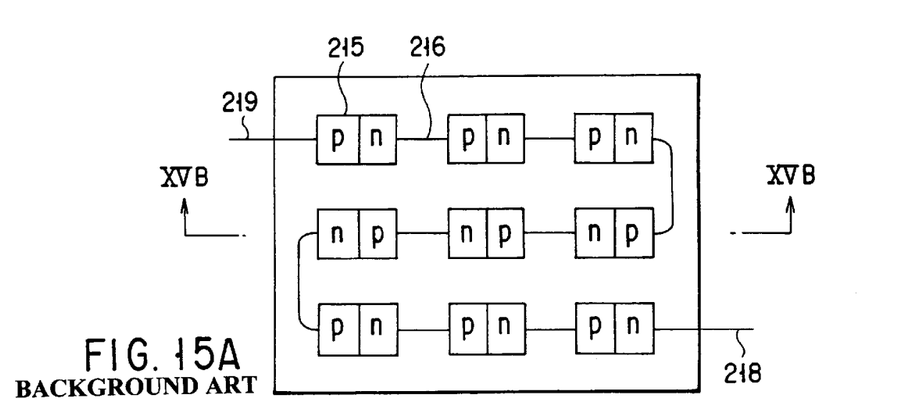
FIG. 15A is a plan view showing a conventional semiconductor infrared detecting device.
Figure 15B:
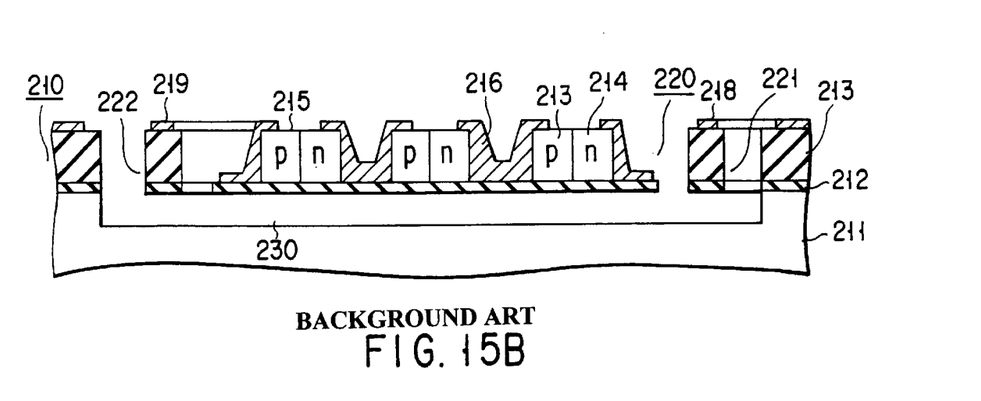
FIG. 15B is a sectional view taken along line XVB—XVB in FIG. 15A.

FIG. 15A is a plan view showing the conventional semiconductor infrared detecting device disclosed in the publication, and FIG. 15B is a sectional view taken along line XVB—XVB in FIG. 15A.

This device is formed by using an SOI substrate 210 consisting of a Si substrate 211, an $SiO_2$ film 212, and a p-Si layer (SOI layer) 213. A thermo-sensing section 220 is supported in a floating state by supporting legs 221 and 222 above the Si substrate 211 with a gap 230 interposed therebetween, and thus is thermally independent of the substrate 211. The thermo-sensing section 220 includes a plurality of diodes 215, each of which is constituted by forming an n-diffusion layer 214 in the p-Si layer 213. The diodes 215 are connected to each other by wiring lines 216, and are connected to external sections by wiring lines 218 and 219.

In this structure, a region for converting heat into electrical signals is limited to the pn junctions, and thus, the thermo-sensing section cannot sufficiently increase in temperature, even if a sufficient energy is incident thereon. As a result, it is difficult to form a semiconductor infrared detecting device with a high sensitivity.

Generally, image pick-up devices using a pn junction utilize the reverse characteristic of the pn junction. In this case, dark current should be suppressed at a low value to detect a voltage increase, and thus the surface area of the pn junction does not have to be larger. On the other hand, solar batteries also utilize the reverse characteristic of a pn junction, in which there is a known technique of enlarging the surface area of the pn junction. In this case, the enlarged surface area is adopted to connect small devices to each other in series to increase the output voltage, or to prevent a high-concentration impurity doped layer from being disposed on a surface on which sunlight is incident.

As described above, in conventional semiconductor infrared detecting devices, where a thermo-sensing section becomes larger, the sensitivity is strengthened, but various problems arise. Furthermore, it is currently demanded to increase the number of pixels, and decrease the size of optical systems, and thus the thermo-sensing section tends to be smaller. For these reasons, it is difficult to attain a sufficiently large sensitivity with the conventional semiconductor infrared detecting devices.

BRIEF SUMMARY OF THE INVENTION

An object of the present invention is to provide a semiconductor infrared detecting device with a high sensitivity and a high responsivity, which can improve the sensitivity without making a thermo-sensing section larger.

Another object of the present invention is to provide an infrared detecting system and an infrared image pick-up system, which employ the semiconductor infrared detecting device.

According to a first aspect of the present invention, there is provided a semiconductor infrared detecting device comprising:

a substrate;

a supporting section arranged on the substrate; and a thermo-sensing section supported by the supporting section above the substrate in a floating state, the thermo-sensing section comprising a first layer consisting essentially of a semiconductor of a first conductivity type, and a second layer consisting essentially of a semiconductor of a second conductivity type, and disposed on the first layer to form a pn junction between the first and second layers, the second layer being in contact with the first layer via an interface comprising projections and recesses, wherein infrared rays are detected with reference to a change in electric current flowing through the pn junction, which is caused when the thermo-sensing section is irradiated with the infrared rays in a state where a bias voltage is applied to the pn junction.

According to a second aspect of the present invention, there is provided a semiconductor infrared detecting system comprising:

the semiconductor infrared detecting device according to the first aspect;

a power supply configured to apply a bias voltage to the pn junction; and a detector configured to detect electric current flowing through the pn junction.

According to a third aspect of the present invention, there is provided a semiconductor infrared image pick-up system comprising:

a plurality of semiconductor infrared detecting devices according to the first aspect, arrayed in a matrix format;

a power supply configured to apply a bias voltage to the pn junction of each of the detecting devices; and a detector configured to detect electric current flowing through the pn junction of each of the detecting devices, wherein an infrared image is picked up with reference to a change in electric current flowing through the pn junctions, which is caused when the thermo-sensing sections are irradiated with infrared rays in a state where a bias voltage is applied to the pn junctions.

According to a fourth aspect of the present invention, there is provided a semiconductor infrared image pick-up system comprising:

a substrate;

a supporting section arranged on the substrate;

a plurality of thermo-sensing sections arrayed in a matrix format, and supported by the supporting section above the substrate in a floating state such that the thermo-sensing sections are thermally substantially independent of each other, each of the thermo-sensing sections comprising a first layer consisting essentially of a semiconductor of a first conductivity type, and a second layer consisting essentially of a semiconductor of a second conductivity type, and disposed on the first layer to form a pn junction between the first and second layers, the second layer being in contact with the first layer via an interface comprising projections and recesses;

a power supply configured to apply a bias voltage to the pn junction of each of the thermo-sensing sections; and a detector configured to detect electric current flowing through the pn junction of each of the thermo-sensing sections, wherein an infrared image is picked up with reference to a change in electric current flowing through the pn junctions, which is caused when the thermo-sensing sections are irradiated with infrared rays in a state where a bias voltage is applied to the pn junctions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described hereinafter with reference to the accompanying drawings. In the following description, the constituent elements having substantially the same function and arrangement are denoted by the same reference numerals, and a repetitive description will be made only when necessary.

[First Embodiment]

Figure 1A:
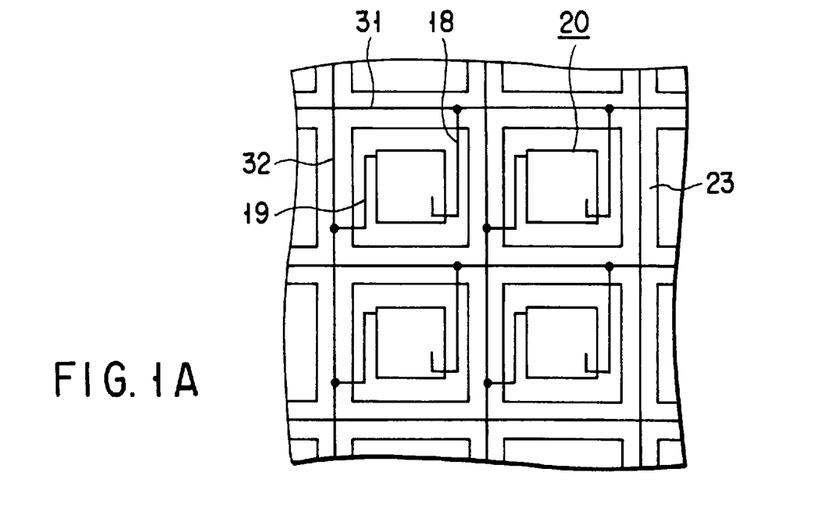
FIG. 1A is a plan view showing thermo-sensing sections in a semiconductor infrared detecting device according to a first embodiment of the present invention.
Figure 1B:
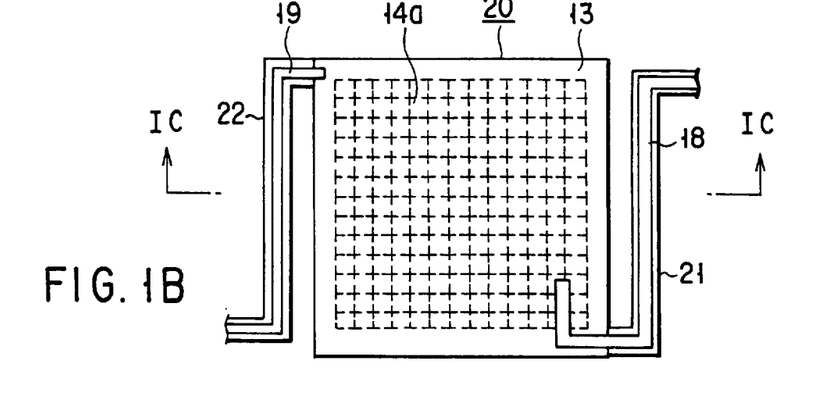
FIG. 1B is a plan view showing one of the thermo-sensing sections.
Figure 1C:
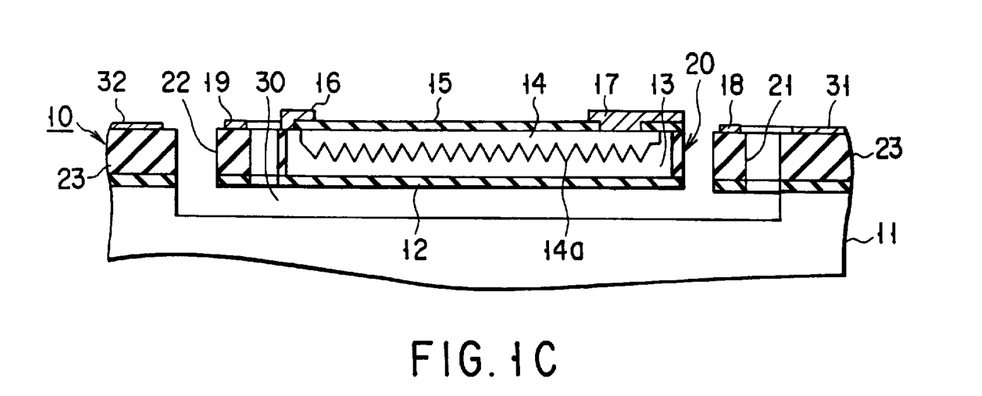
FIG. 1C is a sectional view taken along line IC—IC in FIG. 1B.

FIG. 1A is a plan view showing thermo-sensing sections in a semiconductor infrared detecting device according to a first embodiment of the present invention. FIG. 1B is a plan view showing one of the thermo-sensing sections. FIG. 1C is a sectional view taken along line IC—IC in FIG. 1B.

As shown in FIG. 1A, in this system, a plurality of thermo-sensing sections 20 are arrayed in a matrix format. Each of the thermo-sensing sections 20 is connected to a row address line 31 by a wiring line 18, and to a column address line 32 by a wiring line 19. The thermo-sensing sections (pixels) 20 each have a size of 50 μm×50 mμ and are arrayed in two dimensions of 256 pixels×256 pixels. As shown in FIG. 1B, each of the thermo-sensing sections 20 is supported by two supporting legs 21 and 22 such that it is thermally independent of a base substrate and of the other thermo-sensing sections 20. Wiring lines 18 and 19 are formed on the supporting legs 21 and 22 to connect the thermo-sensing section 20 to the address lines 31 and 32.

More specifically, the thermo-sensing section 20 has a constitution, as shown in FIG. 1C. This device is formed by using an SOI substrate 10 consisting of a Si substrate 11, an SiO$_2$ film 12, and a p-Si layer (SOI layer) 13 having a thickness of 400 nm. On the Si substrate or base substrate 11, a raised portion 23 is formed to extend up to the height of the thermo-sensing sections 20, and to constitute a lattice frame surrounding the respective thermo-sensing sections 20. Opposite side surfaces of each square formed by the raised portion 23 are connected to the corresponding side surfaces of each thermo-sensing section 20 by the supporting legs 21 and 22. With this arrangement, each thermo-sensing section 20 is supported in a floating state above the substrate 11 with a gap 30 interposed therebetween, and thus is thermally independent of the substrate 11.

In each thermo-sensing section 20, an n-diffusion layer 14 is formed in the p-Si layer 13 from the surface down to a depth of about 100 nm in a region except for the peripheral region, so that a pn junction (diode) is formed. The n-diffusion layer 14 has a number of projections 14a, which extend into the p-Si layer 13 and are arrayed in a matrix format (see FIG. 1B). In other words, the interface between the layers 13 and 14 is irregular with the projections and recesses, and has sectional views of a saw-tooth shape in two directions perpendicular to each other. As a result, the surface area of the pn junction according to this embodiment is about 1.3 times larger than that of an ordinary flat interface.

In consideration of merits and demerits in the manufacturing process and the device characteristics, the projections 14a are preferably arranged to satisfy the following conditions. The projections 14a have a depth (the length from the root of each projection 14 to its tip) of from 1/16 to 1/2 (from 25 to 200 mm), and more preferably from 3/40 to 1/4 (from 30 to 100 mm), relative to a total thickness of the first and second layers. The projections 14 have a width of from 0.3 to 3 μm, and more preferably from 0.5 to 1 μm, in a first direction (for example, the horizontal direction in FIG. 1B) on a horizontal plane (which is perpendicular to the thickness direction of the thermo-sensing section 20). The projections 14a are arrayed at a frequency of from 1/25 to 3/2 μm$^{-1}$, and more preferably from 1/5 to 4/5 μm$^{-1}$, in the first direction. More, preferably, the projections 14 have a width and a frequency the same as those in the first direction, also in a second direction perpendicular to the first direction on the horizontal plane.

Parts of the SOI layer 13 and the SiO$_2$ film are removed around the respective thermo-sensing sections 20, except for the supporting legs 21 and 22. Furthermore, parts of the Si substrate 11 below the respective thermo-sensing sections 20 are removed down to a predetermined depth. Consequently, due to the gaps 30, the thermo-sensing sections 20 are thermally independent of the substrate 11 and also of each other.

An insulating film 15 is formed on the surface of the SOI layer 13 and the n-diffusion layer 14. The insulating film 15 is provided with contact holes, in which p-side and n-side electrodes 16 and 17 are disposed. The p-side and n-side electrodes 16 and 17 are connected to the wiring lines 19 and 18, respectively.

Figure 2A:
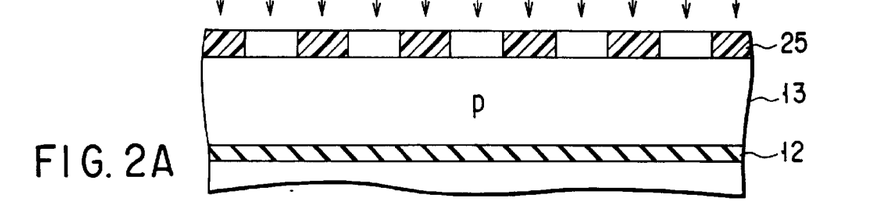
FIGS. 2A and 2B are sectional views showing a method of forming the n-diffusion layer of the thermo-sensing section shown in FIGS. 1A to 1C.
Figure 2B:
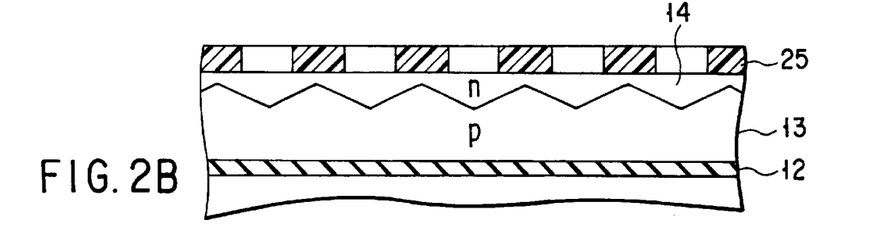

FIGS. 2A and 2B are sectional views showing a method of forming the n-diffusion layer 14. First, as shown in FIG. 2A, a mask 25 is placed on the p-Si layer 13 of the thermo-sensing section 20 and arsenic is ion-implanted into the Si layer 13 therethrough. The mask 25 includes a number of square openings each having a size of 0.5 μm×0.5 μm and arranged in a matrix format with 1.0 μm pitch. Then, the impurity is activated and diffused by a thermal treatment, so that the pn junction having sectional views of a saw-tooth shape is formed, as shown in FIG. 2B.

FIGS. 3A to 3D are sectional views showing a method of separating and fabricating each thermo-sensing section 20. In FIGS. 3A to 3D, the n-diffusion layer 14 and the electrodes 16 and 17 are omitted.

Figure 3A:
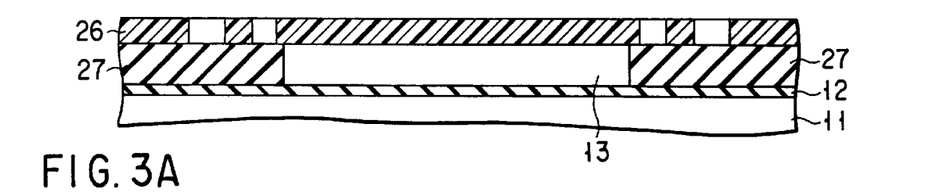
FIGS. 3A, 3B, 3C and 3D are sectional views showing a method of separating and fabricating the thermo-sensing section shown in FIGS. 1A to 1C.

First, a trench is formed in an SOI layer 13 to surround each thermo-sensing section 20, and then is filled with an SiO$_2$ insulating layer to form a surrounding portion 27, which is to be used as a supporting structure for the thermo-sensing sections 20. Then, as shown in FIG. 3A, a mask 26 is formed on the SOI layer 13 to cover the regions corresponding to the thermo-sensing sections 20, the supporting legs 21 and 22, and the address lines 31 and 32.

Figure 3B:
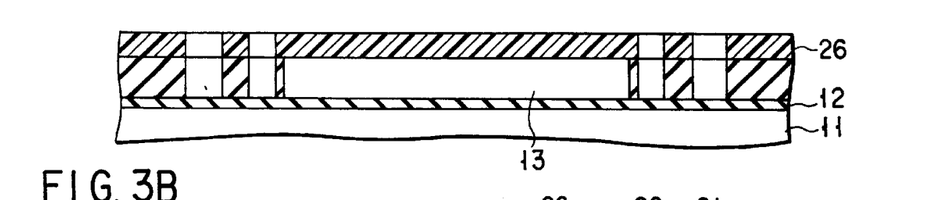
Figure 3C:
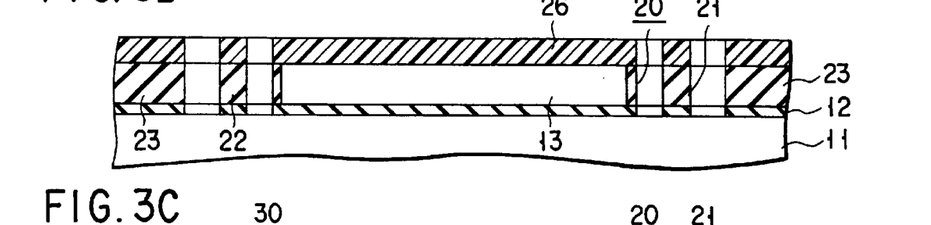
Figure 3D:
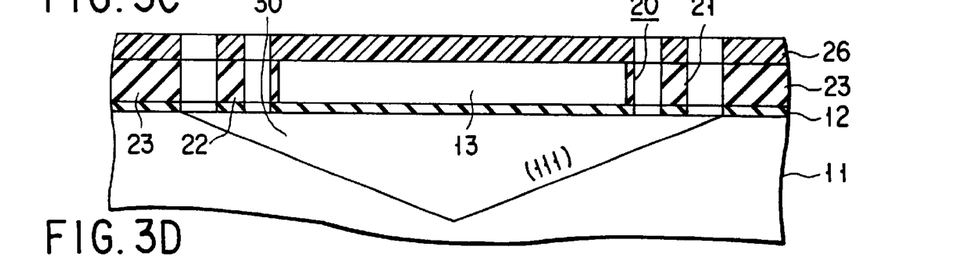

Then, as shown in FIG. 3B, the SiO$_2$ surrounding portion 27 is selectively etched, and, as shown in FIG. 3C, the SiO$_2$ film 12 is selectively etched, by means of RIE, so that the supporting legs 21 and 22, and the raised portion 23 are formed. Then, as shown in FIG. 3D, the Si substrate 11 is etched by means of wet-etching to expose (111) planes of Si crystal. With this step, each thermo-sensing section 20 is independent of the substrate 11 and supported in a floating state only by the supporting legs 21 and 22.

Figure 4:
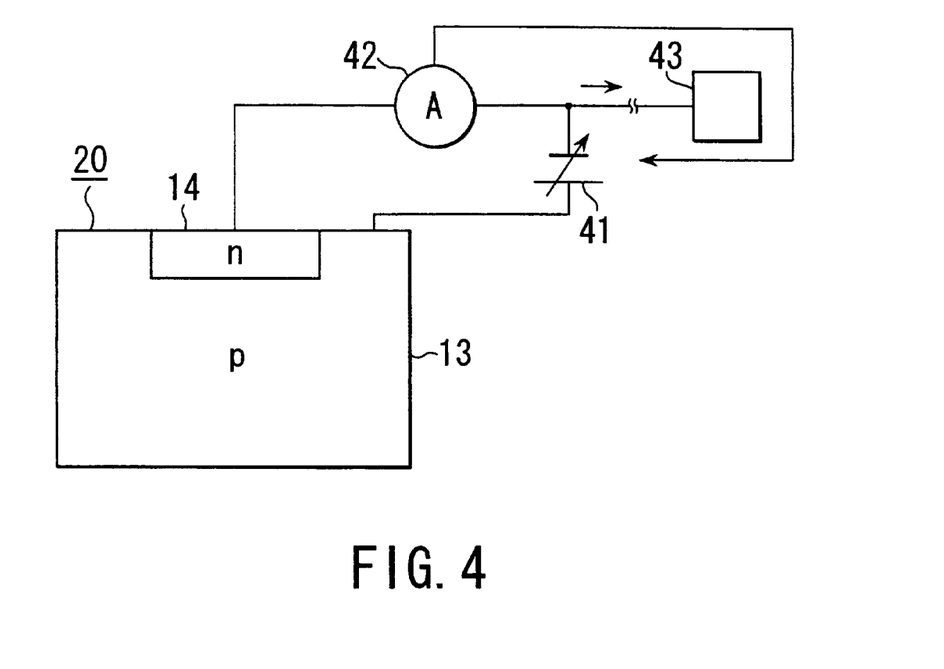
FIG. 4 is a circuit diagram showing a circuit where the thermo-sensing section shown in FIGS. 1A to 1C is used for detecting infrared rays.

FIG. 4 is a circuit diagram showing a circuit where the thermo-sensing section 20 shown in FIGS. 1A to 1C is used for detecting infrared rays.

This circuit includes, for example, a variable power supply (power supply mechanism) 41 and a current detector (current detecting mechanism) 42. The variable power supply is connected to the thermo-sensing section 20 with its positive side connected to the p-layer 13 so as to apply forward bias voltage to the pn junction of the section 20. The current detector 42 is connected between the n-layer 14 and the negative side of the power supply 41 so as to detect forward current (electric current) flowing through the pn junction. The variable power supply 41 is designed, such that it changes the output level on the basis of the results obtained by the current detector 42, as described later.

Where forward bias voltage is applied to the pn junction, forward current flows through the pn junction. The forward current depends on voltage change by a degree sufficiently larger than that by which the reverse current depends on voltage change. Consequently, difference in the forward current (or output) between time points before and after irradiation with infrared rays, i.e., the absolute value of a detection signal, becomes large, whereby a large signal/noise ratio (S/N ratio) can be obtained. As a result, an output difference is easily detected by a signal detector 43 to allow infrared rays to be detected with a high performance.

The variable power supply 41 is designed to change its output level such that, when drift current is detected by the current detector 42, forward current is caused to flow at a level to cancel the drift current. Consequently, even if the drift current is generated, the output of the pn junction consists only of current generated by infrared irradiation, thereby detecting the infrared rays. Note that, if an improvement in detecting performance is the sole purpose, i.e., if the problem of drift current is not considered, the pn junction may be supplied with a reverse voltage from a constant power supply used in place of the variable power supply 41.

As described above, the pixels of this embodiment each have a size of 50 $\mu$m×50 $\mu$m, and are arrayed in two dimensions of 256 pixels×256 pixels. In this case, the surface area of each thermo-sensing section 20 is only 1350 $\mu$m$^2$, excluding the supporting legs 21 and 22, and the peripheral region for row and column address lines 31 and 32. Where the surface area of each thermo-sensing section 20 is increased, so is the surface area of the pn junction. However, in this case, the thermal capacity of the thermo-sensing section 20 is increased, and thus its response speed is reduced.

Accordingly to this embodiment, the surface area of each thermo-sensing section 20 comes to have 1755 $\mu$m$^2$, without an increase in the thermal capacity of the thermo-sensing section 20. In this case, where a forward bias voltage of 0.5V is applied, a resultant current of about 5 $\mu$A is obtained with a thermal noise of about 5 $\mu$V. As other noise components, there is a temperature fluctuation noise of 1 $\mu$V, a current shot noise of 2 $\mu$V, and a low frequency noise of 0.1 $\mu$V. The total noise voltage is about 8.1 $\mu$V, with which an NETD (Noise Equivalent Temperature Deference) of about 0.08 K is obtained when it is measured by using an optical system with f/1 and a transmittance of 65%.

On the other hand, it is assumed that the same measurement is performed on a device with a pn junction having a surface area of 1350 $\mu$m$^2$, fabricated without utilizing the present invention. In this case, where a forward bias voltage of 0.5V is applied, a resultant current of about 3 $\mu$A is obtained with a thermal noise of about 8 $\mu$V. As other noise components, there is a temperature fluctuation noise of 1 $\mu$V, a current shot noise of 2 $\mu$V, and a low frequency noise of 0.1 $\mu$V. The total noise voltage is about 11.1 $\mu$V, with which an NETD of about 0.23 K is obtained when it is measured by using an optical system with f/1 and a transmittance of 65%.

As described above, according to this embodiment, the interface of the layer 13 and 14, which forms the pn junction of each thermo-sensing section 20, is arranged to be irregular with the projections and recesses, thereby increasing the surface area of the pn junction without an increase in the thermal capacity of the thermo-sensing section 20. In other words, the thermal noise component, which is the largest one of the noise components of the thermo-sensing section 20, is reduced, without an increase in the thermal capacity of the thermo-sensing section 20. As a result, it is possible to provide a semiconductor infrared image pick-up system with a high sensitivity and a low power consumption.

Furthermore, since the pn junction is supplied with forward bias voltage, forward current larger than reverse current flows, thereby increasing the output current. Consequently, difference in the forward current between time points before and after irradiation with infrared rays, i.e., the absolute value of a detection signal, becomes large. As a result, a large signal/noise ratio (S/N ratio) can be obtained to improve detecting performance. In addition, since the thermo-sensing section 20 is thermally insulated by the bore or gap 30, it is possible to prevent drift current from being generated due to a change in the ambient temperature.

[Second Embodiment]

Figure 5:
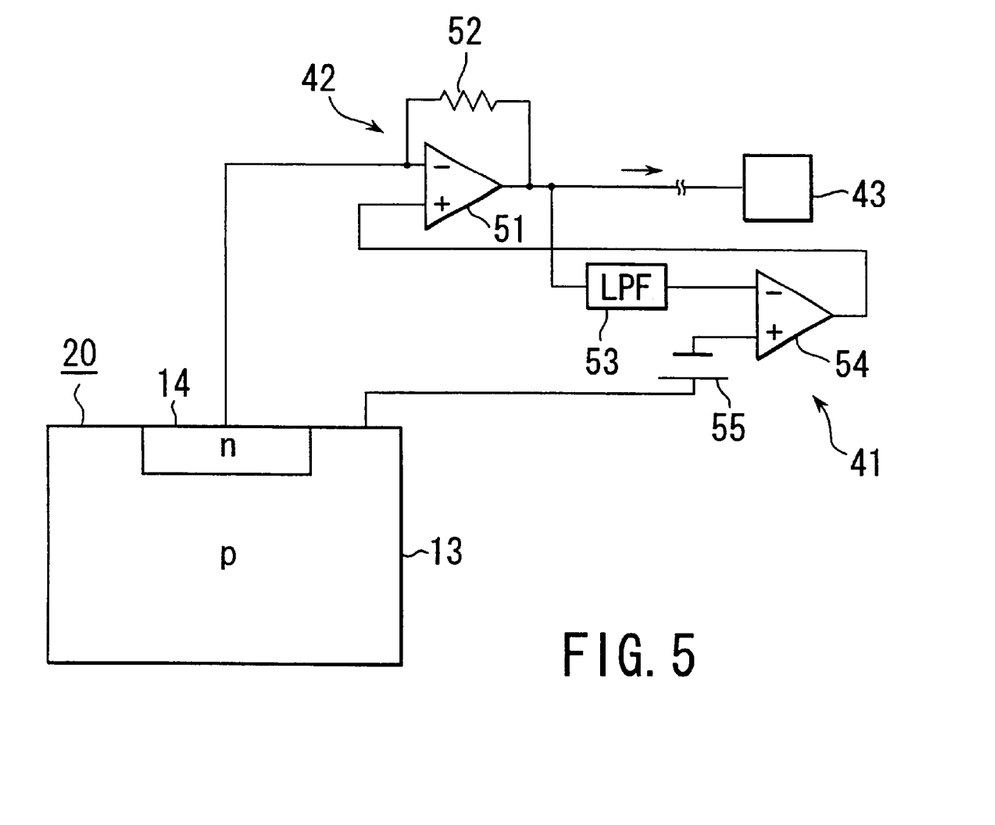
FIG. 5 is a circuit diagram schematically showing the main part of a semiconductor infrared image pick-up system according to a second embodiment of the present invention.

FIG. 5 is a circuit diagram schematically showing the main part (detecting configuration) of a semiconductor infrared image pick-up system according to a second embodiment of the present invention. This embodiment relates to a more concrete configuration of the detecting section of the first embodiment. In this embodiment, a current detector 42 comprises a first differential amplifier 51 and a resistor 52, and a variable power supply 41 comprises a low-pass filter 53, a second differential amplifier 53, and a constant power supply 55.

Where drift current is generated, the output of the first differential amplifier 51 changes. More specifically, a component (drift component), which is lower in frequency and larger in amplitude than the intrinsic detection signal, appears in the output of the first differential amplifier 51. The drift component is extracted through the low-pass filter 53, and is inputted into the minus terminal of the second differential amplifier 54. The plus terminal of the second differential amplifier 54 is connected to the constant power supply 55, and thus the second differential amplifier 54 outputs a current at a level corresponding to the drift current.

The output of the second differential amplifier 54 is inputted into the plus terminal of the first differential amplifier 51. The minus terminal of the first differential amplifier 51 is connected to an n-diffusion layer 14 of a thermo-sensing section 20, and thus the first differential amplifier 51 outputs the intrinsic detection signal formed by subtracting the output corresponding to the drift current from the output of the thermo-sensing section 20. In other words, a signal component corresponding to the drift current, which is lower in frequency and larger in amplitude, does not appear in the output of the first differential amplifier 51.

[Third Embodiment]

Figure 6:
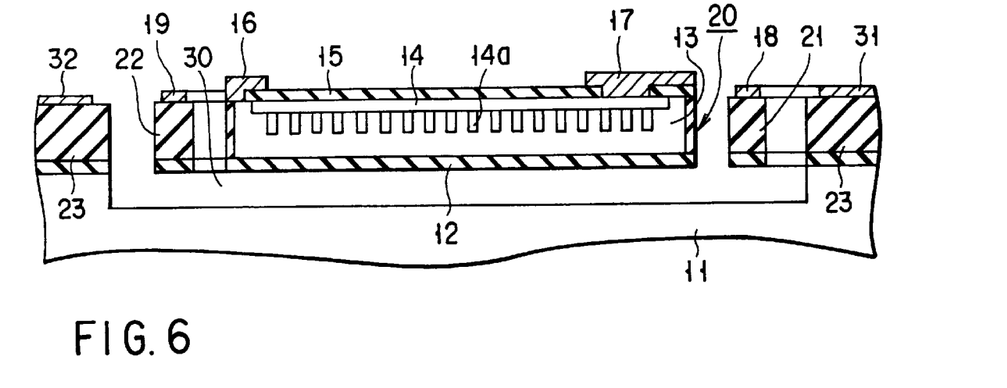
FIG. 6 is a sectional view showing a thermo-sensing section used in a semiconductor infrared image pick-up system according to a third embodiment of the present invention.

FIG. 6 is a sectional view showing a thermo-sensing section used in a semiconductor infrared image pick-up system according to a third embodiment of the present invention. This embodiment differs from the first embodiment in the shape of an n-diffusion layer 14.

In this embodiment, using a mask the same as that of the first embodiment, phosphorus and arsenic are diffused by means of ion-implantation into an SOI layer 13 having a thickness of 500 nm of an SOI substrate. The arsenic is ion-implanted at an acceleration voltage of 30 keV to form a junction at a depth of 300 nm. The phosphorus is ion-implanted at an acceleration voltage of 15 keV to reach to a depth of 100 nm, and then is diffused to form a junction below the mask. With these steps, the n-diffusion layer 14 is formed to have deep projections 14a, as shown in FIG. 6, thereby increasing the surface area of the junction up to about 1.8 times. Where the same measurement as in the first embodiment is performed on this device, an improved NETD of about 0.05K is obtained.

[Fourth Embodiment]

Figure 7A:
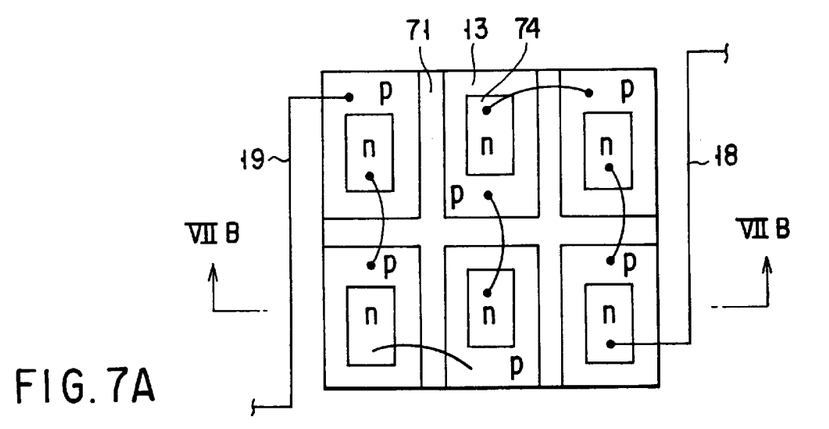
FIG. 7A is a plan view showing a thermo-sensing section used in a semiconductor infrared image pick-up system according to a fourth embodiment of the present invention.
Figure 7B:
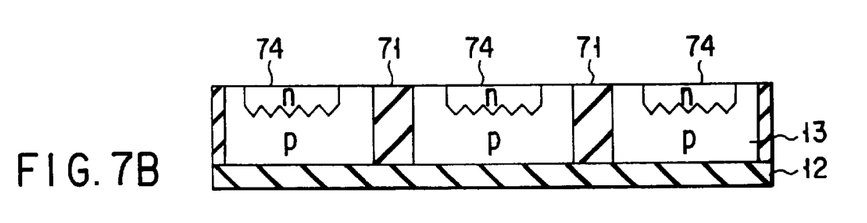
FIG. 7B is a sectional view taken along line VIIB—VIIB in FIG. 7A.

FIG. 7A is a plan view showing a thermo-sensing section used in a semiconductor infrared image pick-up system according to a fourth embodiment of the present invention, and FIG. 7B is a sectional view taken along line VIIB—VIIB in FIG. 7A.

In this embodiment, a SOI layer 13 is divided into, e.g., six device regions by device isolating oxide films 71, and an n-diffusion layer 74 is selectively formed in each device region. Six pn junctions are respectively formed in the six device regions, and are connected to each other in series.

[Fifth Embodiment]

Figure 8:
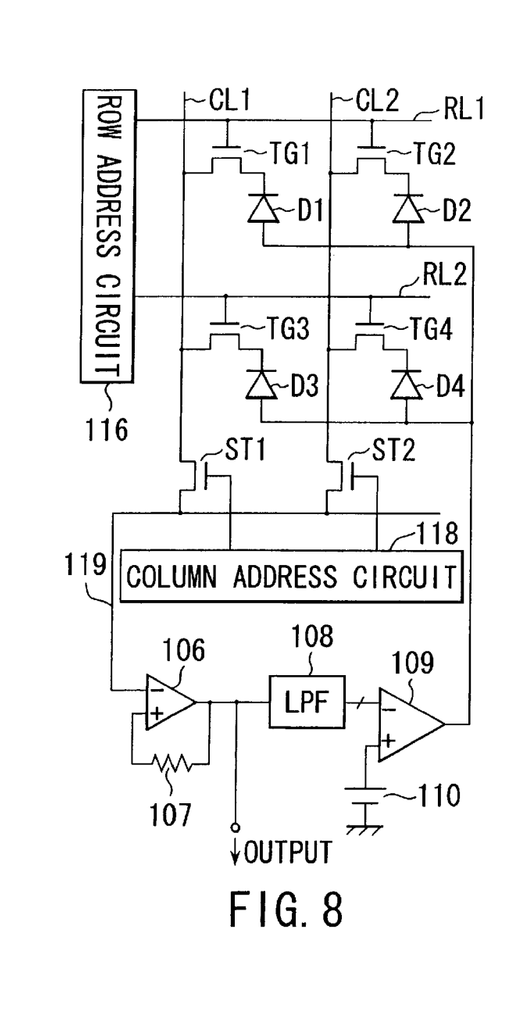
FIG. 8 is a circuit diagram showing a semiconductor infrared image pick-up system of a non-cooling type according to a fifth embodiment of the present invention.

FIG. 8 is a circuit diagram showing a semiconductor infrared image pick-up system of a non-cooling type according to a fifth embodiment of the present invention.

In this image pick-up system, each unit cell comprises one diode Di (i=1, 2, 3, and 4) and one MOS transistor (read-out transistor) TGi (i=1, 2, 3, and 4). For example, the unit cells are arrayed in a matrix format of 2×2. Any one of the thermo-sensing sections 20 shown in FIGS. 1, 6, 7A and 7B can be used as the diode Di.

In each of the MOS transistors TG1 and TG2, the gate is connected to a row address line RL1, one of the source/drains is connected to a column address line CL1 or CL2, and the other of the source/drains is connected to the cathode of the diode D1 or D2. Similarly, in each of the MOS transistors TG3 and TG4, the gate is connected to a row address line RL2, one of the source/drains is connected to a column address line CL1 or CL2, and the other of the source/drains is connected to the cathode of the diode D3 or D4.

The row address lines RL1 and RL2 are connected to a row address circuit 116. The column address lines CL1 and CL2 are connected to a column address circuit 118 through MOS transistors (selection transistor) ST1 and ST2, respectively. In each of the MOS transistors ST1 and ST2, the gate is connected to the column address circuit 118, one of the source/drains is connected to a column address line CL1 or CL2, and the other of the source/drains is connected to an output line 119. The output line 119 is connected to a first differential amplifier 106. The output terminal of a second differential amplifier 109 is connected to the anode of the diode D1.

In the system having this arrangement, at first, one of the row address lines, e.g., the row address line RL1, is set at a potential of the ON level by the row address circuit 116, and the two MOS transistors, e.g., the MOS transistors TG1 and TG2, connecting to this address line are turned on. By this setting, the two diodes, e.g., the diodes D1 and D2, connecting to these MOS transistors are electrically connected to the column address lines CL1 and CL2, respectively.

Then, the MOS transistors ST1 and ST2 are sequentially turned on by the column address line 118. Whereby the outputs of the two diodes, e.g., the diodes D1 and D2, are sequentially inputted into the first differential amplifier 106 through the output line 119. Consequently, the output of the second differential amplifier 109, which is used as the anode input of each of the two diodes, e.g., the diodes D1 and D2, is feed-back-controlled, so that the influence of the drift current is removed from the average output of the two diodes.

Then, the other of the row address lines, e.g., the row address line RL2, is set at a potential of the ON level by the row address circuit 116. Consequently, the output of the second differential amplifier 109, which is used as the anode input of each of the other two diodes, e.g., the diodes D3 and D4, is feed-back-controlled, so that the influence of the drift current is removed from the average output of the two diodes.

Where such operations are repeated, the output of the second differential amplifier 109, which is used as the anode input of each of the four diodes D1 to D4, is feed-back-controlled, so that the influence of the drift current is removed from the average output of the four diodes D1 to D4. As a result, the average output of the four diodes D1 to D4 is controlled to fall in a certain range, while removing drift current components.

In this embodiment, the system is exemplified by the units cells arrayed in a matrix format of 2×2 for the sake of easily understanding the concept. However, even in another matrix format of, e.g., 4×4, 4×5, or several hundreds×several hundreds, the principle is the same. Furthermore, instead of using a two-dimensional matrix format, a one-dimensional linear format may be used.

[Sixth Embodiment]

Figure 9:
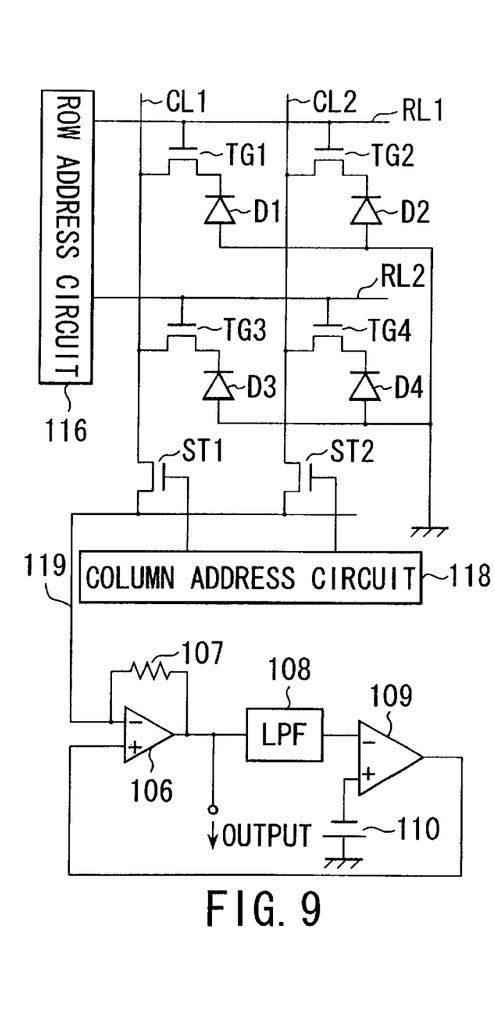
FIG. 9 is a circuit diagram showing a semiconductor infrared image pick-up system of a non-cooling type according to a sixth embodiment of the present invention.
Figure 10:
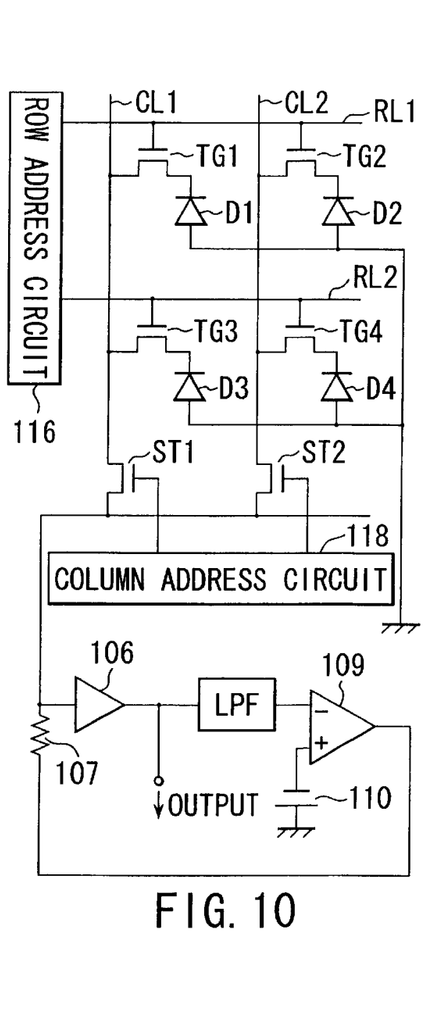
FIG. 10 is a circuit diagram showing a modification to the semiconductor infrared image pick-up system according to the sixth embodiment.

FIGS. 9 and 10 are circuit diagrams each showing a semiconductor infrared image pick-up system of a non-cooling type according to a sixth embodiment of the present invention.

In the fifth embodiment, the anode input of the diodes D1 to D4 is feed-back-controlled. On the other hand, in this embodiment, the potential of an output line 119 is feed-back-controlled, so that the average output of four diodes D1 to D4 is controlled to fall in a certain range. With this embodiment, an effect the same as that of the fifth embodiment is also obtained.

[Seventh Embodiment]

Figure 11:
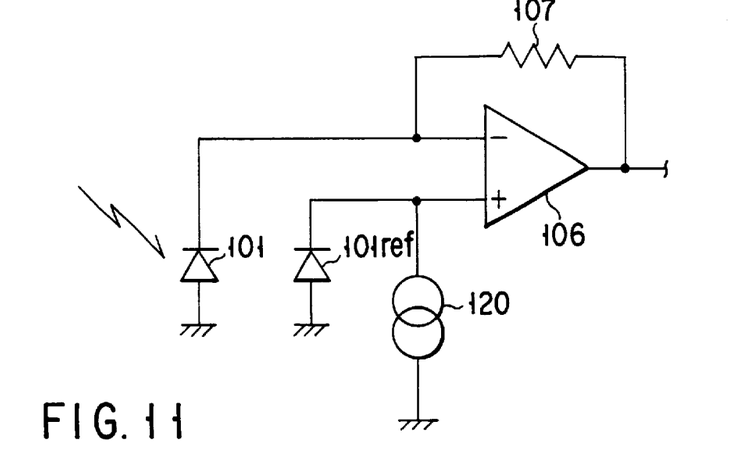
FIG. 11 is a circuit diagram showing a semiconductor infrared detecting system according to a seventh embodiment of the present invention.

FIG. 11 is a circuit diagram showing the main part (detecting configuration) of a semiconductor infrared detecting system of a non-cooling type according to a seventh embodiment of the present invention.

In this embodiment, a differential amplifier 106 provided with a feedback resistor 107 is used. The minus terminal of the differential amplifier 106 is supplied with the output of a diode 101 to be irradiated with infrared rays and actually used for detection. The plus terminal of the differential amplifier 106 is supplied with the output of a reference diode 101ref not to be irradiated with infrared rays but to flow a constant forward current by a constant current supply 120. The outputs of the two diodes 101 and 101ref are compared with each other by the differential amplifier 106, so that the infrared rays are detected. In this case, the diodes 101 and 101ref are fabricated to have a structure the same as each other in accordance with any one of the devices shown in FIGS. 1, 6, 7A and 7B, so that the infrared rays are detected with a high sensitivity and a high accuracy.

[Eighth Embodiment]

Figure 12:
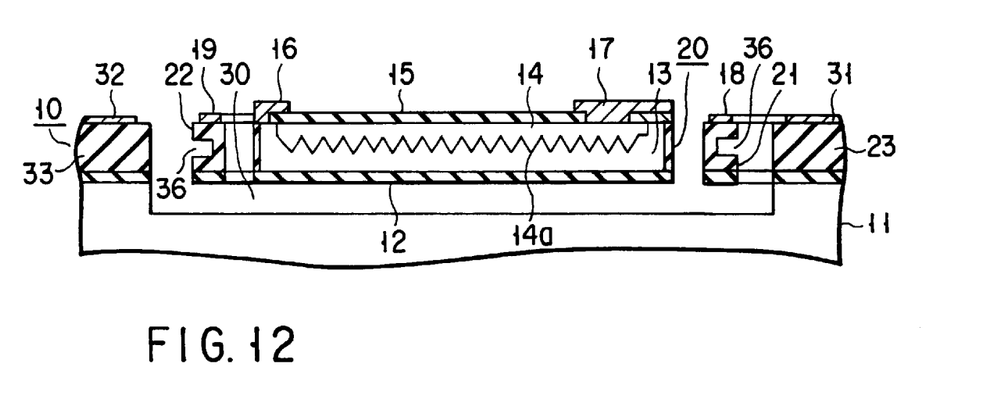
FIG. 12 is a sectional view showing a thermo-sensing section used in a semiconductor infrared image pick-up system according to an eighth embodiment of the present invention.

FIG. 12 is a sectional view showing a thermo-sensing section used in a semiconductor infrared image pick-up system according to an eighth embodiment of the present invention.

In this embodiment, a horizontally extending groove 36 is formed on the outer side surface of each of supporting legs 21 and 22. The groove 36 is formed to reduce the thermal conductivity of the supporting legs 21 and 22 without reducing their mechanical strength. With this arrangement, the thermo-sensing section 20 becomes thermally more independent, along with a small temperature distribution due to the supporting legs 21 and 22, thereby improving the sensitivity. The groove 36 preferably has a vertical width (the dimension in the vertical direction) of from 60 to 600 nm in the supporting legs 21 and 22 each having a vertical thickness of from 0.55 to 4 μm. The groove 36 preferably has a horizontal width (the dimension in the horizontal direction) of from 0.2 to 1.5 μm in the supporting legs 21 and 22 each having to a horizontal thickness of from 0.4 to 2.0 μm.

[Ninth Embodiment]

Figure 13:
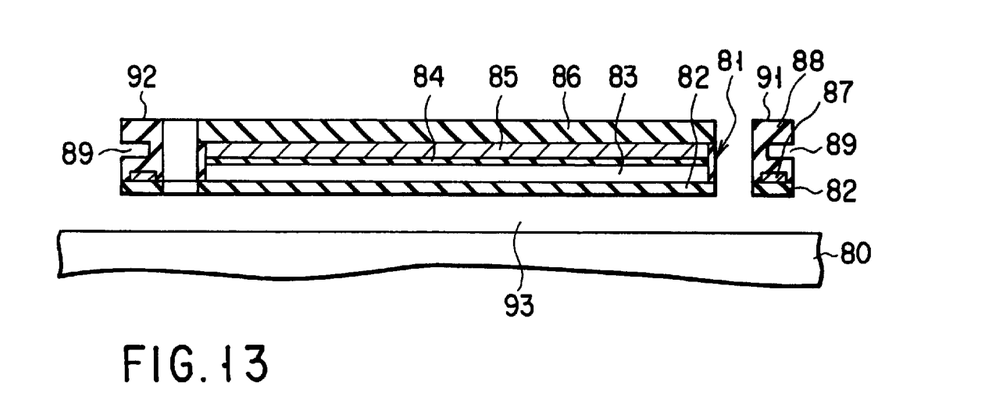
FIG. 13 is a sectional view showing a thermo-sensing section used in a semiconductor infrared image pick-up system according to a ninth embodiment of the present invention.

FIG. 13 is a sectional view showing a thermo-sensing section used in a semiconductor infrared image pick-up system according to a ninth embodiment of the present invention. In this embodiment, the thermo-sensing section has a bolometer layer, which changes in resistance by infrared irradiation, in place of a pn junction.

A thermo-sensing section 81 is supported in a floating state by supporting legs 91 and 92 above a base substrate 80 with a gap 93 interposed therebetween, and thus is thermally independent of the substrate 80. The thermo-sensing section 81 includes an insulating layer 82 having a thickness of 150 nm, a bolometer layer 83 having a thickness of 400 nm, and an insulating layer 84 having a thickness of 200 nm, which are stacked one on top of the other. On the insulating layer 84, an aluminum layer 85 having a thickness of 60 nm for lowering the temperature distribution over the thermo-sensing section, and an insulating layer 86 having a thickness of 500 nm are stacked in this order.

On the other hand, in each of the supporting legs 91 and 92, a titanium wiring layer 87 having a thickness of 100 nm is disposed on the insulating layer 82 having a thickness of 150 nm, and an insulating layer 88 having a thickness of 500 nm is formed on the layers 82 and 87. A horizontally extending groove 89 having a thickness (the vertical width) of 60 nm is formed on the outer side surface of the insulating layer 88. The narrowest portion of the insulating layer 88 has a horizontal width of 1.5 μm.

The groove 89 is formed for the same purpose as that of the groove 36, i.e., to reduce the thermal conductivity of the supporting legs 91 and 92 without reducing their mechanical strength. Accordingly, the size of the groove 89 is preferably set to fall in the range for the groove 36, as described above.

In an experiment, the thermal conductivity of each of the supporting legs 91 and 92 decreased by about 10%, and the sensitivity increased by 10%, as compared to the structure before the groove 89 was formed. As regards the mechanical strength, each of the supporting legs 91 and 92 withstood an acceleration of 200 G in a direction perpendicular to the light receiving surface.

[Tenth Embodiment]

Figure 14:
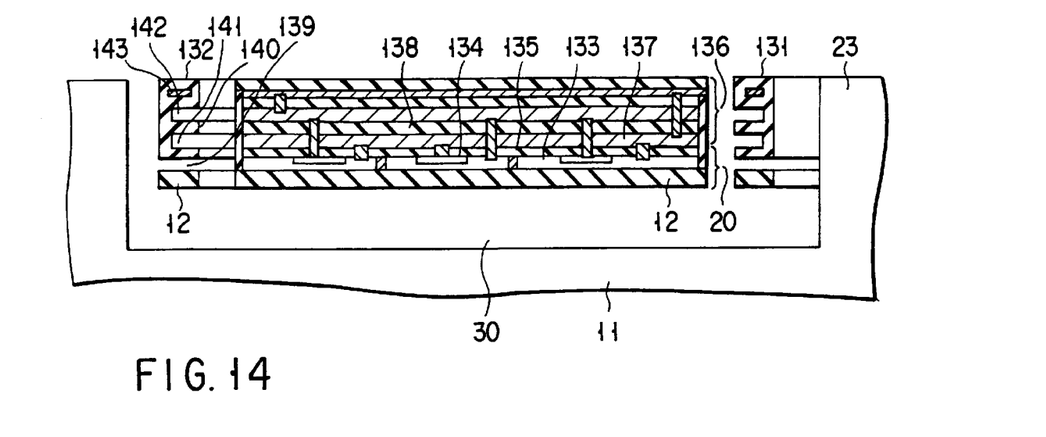
FIG. 14 is a sectional view showing a thermo-sensing section used in a semiconductor infrared image pick-up system according to a tenth embodiment of the present invention.

FIG. 14 is a sectional view showing a thermo-sensing section used in a semiconductor infrared image pick-up system according to a tenth embodiment of the present invention. In this embodiment, the thermo-sensing section includes a plurality of diode-pn junctions of the stacked type, as shown in FIGS. 7A and 7B, and the pn junctions are connected to each other in series by a wiring structure having a multi-layer structure. Note that, the wiring structure has been patterned to leave only the necessary portions, but it is shown as uniformly stacked on the thermo-sensing section in FIG. 14 for the sake of convenience.

A thermo-sensing section 20 is supported in a floating state by supporting legs 131 and 132 above a Si substrate 11 with a gap 30 interposed therebetween, and thus is thermally independent of the substrate 11. The thermo-sensing section 20 includes an insulating layer 12 having a thickness of 150 nm, a single-crystalline Si layer 133 having a thickness of 400 nm, and an insulating layer 135 having a thickness of 200 nm, which are stacked one on top of the other. In the Si layer 133, a plurality of pn junctions 134 are formed by diffusing an impurity by means of ion-implantation and so forth.

The pn junctions 134 are respectively formed in the device regions separated from each other by device isolating portions, and are connected to each other in series by a wiring structure 136 having a multi-layer structure formed on the insulating layer 135. The wiring structure 136 is formed by alternately stacking aluminum layers 137 having a thickness of 400 nm and insulating layers 138 having a thickness of 500 nm.

On the other hand, in each of the supporting legs 131 and 132, a gap 139 having a thickness of 400 nm is formed by etching the Si layer 133 on the insulating layer 12 having a thickness of 150 nm. An insulating layer 140 having a thickness of 2.5 μm is arranged above the insulating layer 12 with the gap 139 interposed therebetween. Horizontally extending grooves 141 and 142 each having a thickness (the vertical width) of 400 nm is formed on the inner side surface of the insulating layer 140. The narrowest portion of the insulating layer 140 has a horizontal width of 1.5 μm. In the upper portion of the insulating layer 140, a Ti wiring layer 143 is embedded.

The grooves 141 and 142 are formed for the same purpose as that of the groove 36, i.e., to reduce the thermal conductivity of the supporting legs 131 and 132 without reducing their mechanical strength. Accordingly, the size of the grooves 141 and 142 is preferably set to fall in the range for the groove 36, as described above.

In an experiment, the thermal conductivity of each of the supporting legs 141 and 142 decreased by about 40%, and the sensitivity increased by 40%, as compared to the structure before the grooves 141 and 142 were formed. As regards the mechanical strength, each of the supporting legs 131 and 132 withstood an acceleration of 300 G in a direction perpendicular to the light receiving surface.

In the ninth and tenth embodiments, each of the grooves 89, 141, and 142 is formed by etching an aluminum layer that has been once stacked. In this case, the pattern of the aluminum layer is intentionally formed to be shifted from the end of the pattern of each supporting leg by 200 nm. Where the pattern shift is 100 nm or less, the narrowest portion of the insulating layer is etched when the gap under the thermo-sensing section is formed by etching, thereby further reducing the thermal conductivity of the supporting legs, while increasing the sensitivity. As regards the mechanical strength, even where such a pair of supporting legs are used, it is expected to increase the strength by about 10%, as compared to a device employing only one supporting leg.

The present invention is not limited to the embodiments described above. For example, the embodiments employ two supporting legs for supporting a thermo-sensing section, but may employ only one supporting leg. The shape of the interface between two layers for forming a pn junction is not limited to those shown in FIGS. 1C and 6, but may be any irregular shape for increasing the surface area. Furthermore, the number, array pattern, and so forth of thermo-sensing sections can be changed, if necessary, in accordance with a predetermined design.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor infrared detecting device comprising:
a substrate;
a supporting section arranged on the substrate; and
a thermo-sensing section supported by the supporting section above the substrate in a floating state, the thermo-sensing section comprising,
a first layer consisting essentially of a semiconductor of a first conductivity type, and
a second layer consisting essentially of a semiconductor of a second conductivity type, and disposed on the first layer to form a pn junction between the first and second layers, the second layer being in contact with the first layer via an interface comprising projections and recesses,
wherein infrared rays are detected with reference to a change in electric current flowing through the pn junction, which is caused when the thermo-sensing section is irradiated with the infrared rays in a state where a bias voltage is applied to the pn junction, and
wherein the projections have a width of from 0.3 to 3 $\mu$m in a first direction substantially perpendicular to a thickness direction of the thermo-sensing section.

2. The device according to claim 1, wherein the thermo-sensing section comprises an insulating layer disposed on the substrate side, and the insulating layer, the first layer, and the second layer are stacked in a thickness direction of the thermo-sensing section, such that the first layer is sandwiched between the insulating layer and the second layer.

3. The device according to claim 1, wherein the projections have a length of from $\frac{1}{16}$ to $\frac{1}{2}$ a total thickness of the first and second layers.

4. The device according to claim 1, wherein the projections are arrayed at a frequency of from $\frac{1}{25}$ to $\frac{3}{2}$ $\mu$m$^{-1}$ in a first direction substantially perpendicular to a thickness direction of the thermo-sensing section.

5. The device according to claim 4, wherein the projections are arrayed at a frequency of from $\frac{1}{25}$ to $\frac{3}{2}$ $\mu$m$^{-1}$ in a second direction substantially perpendicular to a thickness direction of the thermo-sensing section and the first direction.

6. The device according to claim 1, wherein the second layer with the interface comprises a portion formed by doping the first layer with a carrier impurity of the second conductivity type.

7. The device according to claim 1, wherein the substrate consists essentially of a semiconductor.

8. The device according to claim 1, wherein the substrate consists of Si, and the substrate has a face formed of (111) planes of Si crystal and facing the thermo-sensing section.

9. The device according to claim 1, wherein the first and second layers are divided into device regions by device isolating portions extending in a thickness direction of the thermo-sensing section, and the pn junction comprises pn junction portions respectively arranged in the device regions and connected to each other in series.

10. The device according to claim 1, wherein the supporting section comprises a supporting leg connecting the substrate and the thermo-sensing section to each other.

11. The device according to claim 10, wherein a groove is formed on a side surface of the supporting leg to across a thickness direction of the supporting leg.

12. The device according to claim 11, wherein the groove has a width of from 60 to 600 nm in the thickness direction of the supporting leg.

13. The device according to claim 10, wherein the supporting leg is formed of a plurality of thin films stacked one another.

14. The device according to claim 13, wherein each of the thin films has a thickness of from 60 to 600 nm.

15. A semiconductor infrared detecting system comprising:
a semiconductor infrared detecting device comprising,
a substrate,
a supporting section arranged on the substrate, and
a thermo-sensing section comprising,
a first layer consisting essentially of a semiconductor of a first conductivity type, and
a second layer consisting essentially of a semiconductor of a second conductivity type, and disposed on the first layer to form a pn junction between the first and second layers, the second layer being in contact with the first layer via an interface comprising projections and recesses,
wherein infrared rays are detected with reference to a change in electric current flowing through the pn junction, which is caused when the thermo-sensing section is irradiated with the infrared rays in a state where a bias voltage is applied to the pn junction;
a power supply configured to apply a bias voltage to the pn junction; and
a detector configured to detect electric current flowing through the pn junction, and
wherein the projections have a width of from 0.3 to 3 $\mu$m in a first direction substantially perpendicular to a thickness direction of the thermo-sensing section.

16. The system according to claim 15, wherein the power supply comprises a variable power supply configured to change its output level such that a forward current is caused to flow through the pn junction at a level to cancel drift current.

17. The system according to claim 15, wherein the detector comprises a first differential amplifier having first and second input terminals, which are connected to the pn junction and a constant power supply, respectively.

18. The system according to claim 15, wherein the detector comprises a first differential amplifier having first and second input terminals, which are connected to the pn junction and a constant current supply, respectively.

19. The system according to claim 15, wherein the detector comprises a first differential amplifier having first and second input terminals and a first output terminal, and the power supply comprises a second differential amplifier having third and fourth input terminals and a second output terminal, such that the first and second input terminals are connected to the pn junction and the second output terminal, respectively, and the third and fourth input terminals are connected to the first output terminal and a constant power supply, respectively.

20. A semiconductor infrared image pick-up system comprising:
a plurality of semiconductor infrared detecting devices, arrayed in a matrix format, wherein said plurality of semiconductor infrared detecting devices comprises,
a substrate,
a supporting section arranged on the substrate, and
a thermo-sensing section comprising,
a first layer consisting essentially of a semiconductor of a first conductivity type, and
a second layer consisting essentially of a semiconductor of a second conductivity type, and disposed on the first layer to form a pn junction between the first and second layers, the second layer being in contact with the first layer via an interface comprising projections and recesses, wherein infrared rays are detected with reference to a change in electric current flowing through the pn junction, which is caused when the thermo-sensing section is irradiated with the infrared rays in a state where a bias voltage is applied to the pn junction;

a power supply configured to apply a bias voltage to the pn junction of each of the detecting devices; and a detector configured to detect electric current flowing through the pn junction of each of the detecting devices, wherein an infrared image is picked up with reference to a change in electric current flowing through the pn junctions, which is caused when the thermo-sensing sections are irradiated with infrared rays in a state where a bias voltage is applied to the pn junctions, and wherein the projections have a width of from 0.3 to 3 $\mu$m in a first direction substantially perpendicular to a thickness direction of the thermo-sensing section.

21. The system according to claim 20, further comprising an address circuit configured to alternately select the detecting devices and connect the selected device to the detector.

22. A semiconductor infrared image pick-up system comprising:

a substrate;

a supporting section arranged on the substrate;

a plurality of thermo-sensing sections arrayed in a matrix format, and supported by the supporting section above the substrate in a floating state such that the thermo-sensing sections are thermally substantially independent of each other, each of the thermo-sensing sections comprising a first layer consisting essentially of a semiconductor of a first conductivity type, and a second layer consisting essentially of a semiconductor of a second conductivity type, and disposed on the first layer to form a pn junction between the first and second layers, the second layer being in contact with the first layer via an interface comprising projections and recesses;

a power supply configured to apply a bias voltage to the pn junction of each of the thermo-sensing sections; and a detector configured to detect electric current flowing through the pn junction of each of the thermosensing sections, wherein an infrared image is picked up with reference to a change in electric current flowing through the pn junctions, which is caused when the thermo-sensing sections are irradiated with infrared rays in a state where a bias voltage is applied to the pn junctions, and wherein the projections have a width of from 0.3 to 3 $\mu$m in a first direction substantially perpendicular to a thickness direction of the thermo-sensing section.

23. A semiconductor infrared detecting device comprising:

a substrate;

a supporting section arranged on the substrate; and a thermo-sensing section supported by the supporting section above the substrate in a floating state, the thermo-sensing section comprising a first layer consisting essentially of a semiconductor of a first conductivity type, and a second layer consisting essentially of a semiconductor of a second conductivity type, and disposed on the first layer to form a pn junction between the first and second layers, the second layer being in contact with the first layer via an interface comprising projections and recesses, wherein infrared rays are detected with reference to a change in electric current flowing through the pn junction, which is caused when the thermo-sensing section is irradiated with the infrared rays in a state where a bias voltage is applied to the pn junction, and wherein the projections have a length of from 1/16 to 1/2 a total thickness of the first and second layers.

24. A semiconductor infrared detecting device comprising:

a substrate;

a supporting section arranged on the substrate; and a thermo-sensing section supported by the supporting section above the substrate in a floating state, the thermo-sensing section comprising a first layer consisting essentially of a semiconductor of a first conductivity type, and a second layer consisting essentially of a semiconductor of a second conductivity type, and disposed on the first layer to form a pn junction between the first and second layers, the second layer being in contact with the first layer via an interface comprising projections and recesses, wherein infrared rays are detected with reference to a change in electric current flowing through the pn junction, which is caused when the thermo-sensing section is irradiated with the infrared rays in a state where a bias voltage is applied to the pn junction, and wherein the projections are arrayed at a frequency of from 1/25 to 3/2 $\mu$m$^{-1}$ in a first direction substantially perpendicular to a thickness direction of the thermo-sensing section.

25. The device according to claim 24, wherein the projections are arrayed at a frequency of from 1/25 to 3/2 $\mu$m$^{-1}$ in a second direction substantially perpendicular to a thickness direction of the thermo-sensing section and the first direction.

* * * * *